(12) United States Patent
Kim et al.

(10) Patent No.: US 7,652,382 B2
(45) Date of Patent: Jan. 26, 2010

(54) MICRO CHIP-SCALE-PACKAGE SYSTEM

(75) Inventors: Jong Kook Kim, Suwon (KR); Hun Teak Lee, Ichon (KR); Jason Lee, Seoul (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 11/869,737

(22) Filed: Oct. 9, 2007

(65) Prior Publication Data

US 2008/0029861 A1 Feb. 7, 2008

Related U.S. Application Data

(63) Continuation of application No. 11/307,314, filed on Jan. 31, 2006, now Pat. No. 7,298,052.

(60) Provisional application No. 60/594,608, filed on Apr. 22, 2005.

(51) Int. Cl.
| | |
|---|---|
| H01L 23/12 | (2006.01) |
| H01L 23/48 | (2006.01) |
| H01L 23/52 | (2006.01) |
| H01L 29/40 | (2006.01) |
| H01L 21/00 | (2006.01) |

(52) U.S. Cl. .................. 257/782; 257/783; 438/118

(58) Field of Classification Search ............... 257/784, 257/698, 706, 707, 781, 701, 782, 787, 693, 257/700, 783; 438/112, 118, 125, 126, 127
See application file for complete search history.

(56) References Cited

U.S. PATENT DOCUMENTS

| | | | | |
|---|---|---|---|---|
| 5,273,938 | A | * | 12/1993 | Lin et al. ................. 438/107 |
| 5,683,942 | A | * | 11/1997 | Kata et al. ................ 438/118 |
| 6,545,367 | B2 | * | 4/2003 | Sota ........................ 257/784 |
| 6,566,168 | B2 | | 5/2003 | Gang |
| 6,586,834 | B1 | | 7/2003 | Sze et al. |
| 6,611,063 | B1 | * | 8/2003 | Ichinose et al. ........... 257/784 |
| 6,710,437 | B2 | | 3/2004 | Takahashi et al. |
| 6,746,897 | B2 | | 6/2004 | Fukutomi et al. |
| 6,822,323 | B1 | | 11/2004 | Kim et al. |
| 7,074,650 | B2 | * | 7/2006 | Honda ..................... 438/108 |
| 7,102,225 | B2 | * | 9/2006 | Khan et al. ............... 257/706 |
| 7,154,166 | B2 | * | 12/2006 | Ano ........................ 257/676 |
| 7,187,072 | B2 | * | 3/2007 | Fukutomi et al. .......... 257/693 |

* cited by examiner

Primary Examiner—S. V Clark
(74) Attorney, Agent, or Firm—Mikio Ishimaru

(57) ABSTRACT

A micro chip-scale-package system including providing a metal pattern on an adhesion material, attaching an integrated circuit die to the metal pattern, and molding an encapsulant over the integrated circuit die and the metal pattern.

18 Claims, 4 Drawing Sheets

MICRO CHIP-SCALE-PACKAGE SYSTEM

CROSS-REFERENCE TO RELATED APPLICATION(S)

This application is a continuation of U.S. Non Provisional patent application Ser. No. 11/307,314 filed Jan. 31, 2006, which claims the benefit of U.S. Provisional Patent Application Ser. No. 60/594,608 filed Apr. 22, 2005, and the subject matter thereof is hereby incorporated herein by reference thereto.

TECHNICAL FIELD

The present invention relates generally to packages, and more particularly to a system for a chip-scale-package.

BACKGROUND ART

Integrated circuit devices and packages are used in equipment and products including cars, planes, industrial control systems as well as the appliances and devices we typically associate with electronics. The growing numbers of portable electronics, such as cell phones, portable computers, voice recorders, etc., are some of these devices. However, across virtually all the uses for integrated circuit devices, there continues to be a demand for reducing the size and increasing the features or functions as well as the performance. We want more features for less size, weight and cost from the largest equipment to the smallest device. Continued improvement in integrated circuit devices and packages are a significant part of the smaller size, more functions and high performance.

As the demand for electronic devices grows, manufacturers are seeking ways to reduce the size and cost of the packaged integrated circuit devices. To meet these needs, packaging technologies are shifting towards smaller dimensions in both the integrated circuit devices and packages. This is driving the demand for smaller integrated circuit device packages and higher I/O pin counts. These smaller packages, such as chip-scale-packages, are scarcely larger than the tiny integrated circuit devices they protect. Unfortunately, this smaller size and the increased functions bring along their own set of problems, many of which have significantly negative effects on the reliability, assembly processes, high volume production and costs of the devices and products in which they are included.

In most chip-scale-packages, a printed circuit board (PCB), film, or lead frame has been used as a base or a substrate. This type of package structure, particularly when using a PCB substrate, has suffered from reliability problems in part due to poor adhesion between molding compounds and the surfaces of the base or substrate. Many chip-scale-packages suffer from poor adhesion between the molding compound and the solder mask of the PCB or film substrate. Similarly, adhesion problems plague the film substrates as well.

As for the lead frame chip-scale-package, attempts for improvements suffer from limitations in increasing the number of the I/O pin counts for the packages. The lead frame types of leads or electrical connections, such as peripheral types of leads, significantly limit the number of the I/O of the package. These packages impose their capacity limitations on the functions of the integrated circuit devices that they contain, rather than address the demands of increasing features and functions.

Many other attempts have been unsuccessful in meeting the demands of continued decreases in size, increases in functions while improving reliability and cost effective volume manufacturing. These attempts at decreasing size and increasing functions have complicated assembly processes. The attempts have also been difficult to apply in the production processes for the chip-scale-packages. The complications and difficulties have had a negative effect on package reliability and costs.

Thus, a need still remains for a micro chip-scale-package system to provide smaller size, increased I/O pin count, improved reliability, simpler assembly processes and easy implementation in high volume production and lower costs. In view of the increasing demand for improved density of integrated circuit devices and their packages, particularly portable electronic products, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a micro chip-scale-package system providing a metal pattern on an adhesion material, attaching an integrated circuit die to the metal pattern, and molding an encapsulant over the integrated circuit die and the metal pattern.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
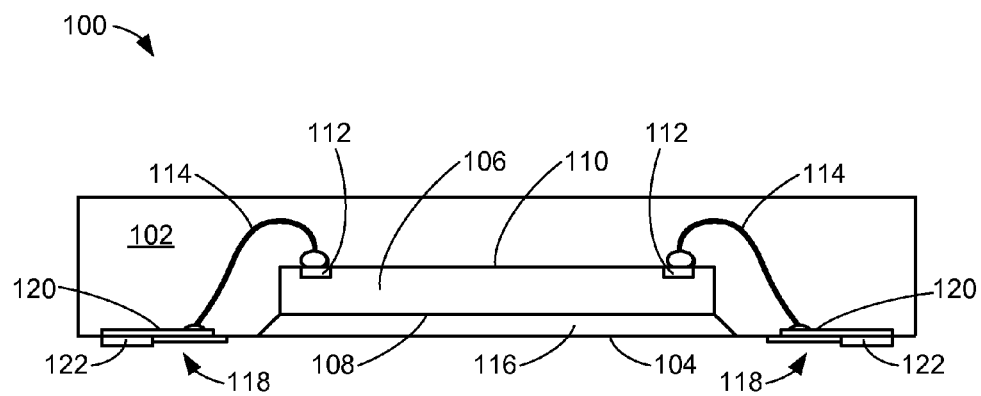
FIG. 1 is a cross-sectional view of a micro chip-scale-package system in an embodiment of the present invention.

In the following description, numerous specific details are given to provide a thorough understanding of the invention. However, it will be apparent that the invention may be practiced without these specific details. In order to avoid obscuring the present invention, some well-known circuits, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGs. Similarly, although the sectional views in the drawings for ease of description show the invention with surfaces as oriented upward or downward, this arrangement in the FIGs. is arbitrary and is not intended to suggest that invention should necessarily be in an upward or downward direction. Generally, the device can be operated in any orientation. The same numbers are used in the drawing FIGs. to relate to the same elements.

The term "horizontal" as used herein is defined as a plane parallel to the conventional plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of a micro chip-scale-package system 100 in an embodiment of the present invention. The micro chip-scale-package system 100 includes an encapsulant 102, having a bottom surface 104. The encapsulant 102 is applied over an integrated circuit die 106, having a non-active surface 108 and an active surface 110. The active surface 110 of the integrated circuit die 106 includes a bond surface 112 for an electrical interconnection 114. The non-active surface 108 of the integrated circuit die 106 is attached to a film with a die attach material 116, such as a die attach adhesive. A metal pattern 118 includes a contact surface 120 as well as signal I/O pins 122. The electrical interconnection 114 connects the bond surface 112 of the active surface 110 to the contact surface 120 providing electrical connectivity between the integrated circuit die 106 and the metal pattern 118.

The micro chip-scale-package system 100 protects the integrated circuit die 106 using the encapsulant 102. Further, the bottom surface 104 of the encapsulant 102 of the micro chip-scale-package system 100 may provide mechanical connectivity to a next level system (not shown) such as a printed circuit board. Yet further, the signal I/O pins 122 of the micro chip-scale-package system 100 provide electrical connectivity for the integrated circuit die 106 to the next level system. For illustrative purposes, the micro chip-scale-package system 100 is shown with the electrical interconnection 114 as a wire bond, although it is understood that other electrical connectors may be used.

Figure 2:
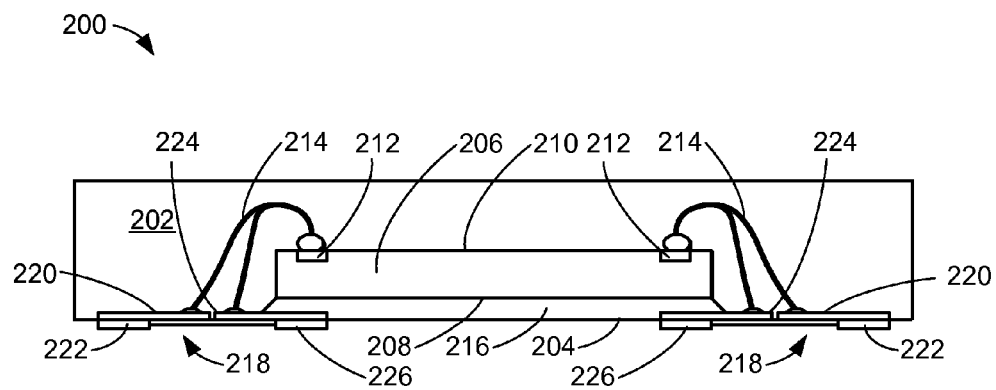
FIG. 2 is a micro chip-scale-package system with high pin count in an alternative embodiment of the present invention.

Referring now to FIG. 2, therein is shown a micro chip-scale-package system 200 with high pin count in an alternative embodiment of the present invention. In a manner similar to the micro chip-scale-package system 100, the micro chip-scale-package system 200 includes an encapsulant 202, having a bottom surface 204. The bottom surface 204 of the encapsulant 202 is substantially exposed. The encapsulant 202 is applied over a high pin count integrated circuit die 206, having a non-active surface 208 and an active surface 210. The active surface 210 of the high pin count integrated circuit die 206 includes a bond surface 212 for an electrical interconnection 214. The non-active surface 208 of the high pin count integrated circuit die 206 is attached to a film (not shown) with a die attach material 216, such as a die attach adhesive.

A metal pattern 218 includes a first contact surface 220, a first set of signal I/O pins 222, a second contact surface 224 and a second set of signal I/O pins 226. The second contact surface 224 and the second set of signal I/O pins 226 provide increased I/O pin count for the high pin count integrated circuit die 206. The electrical interconnection 214 connects the bond surface 212 of the active surface 210 to the first contact surface 220 or the second contact surface 224 to provide electrical connectivity between the high pin count integrated circuit die 206 and the metal pattern 218. For illustrative purposes, the micro chip-scale-package system 200 is shown with the electrical interconnection 114 as a wire bond, although it is understood that other electrical connectors may be used.

Figure 3:
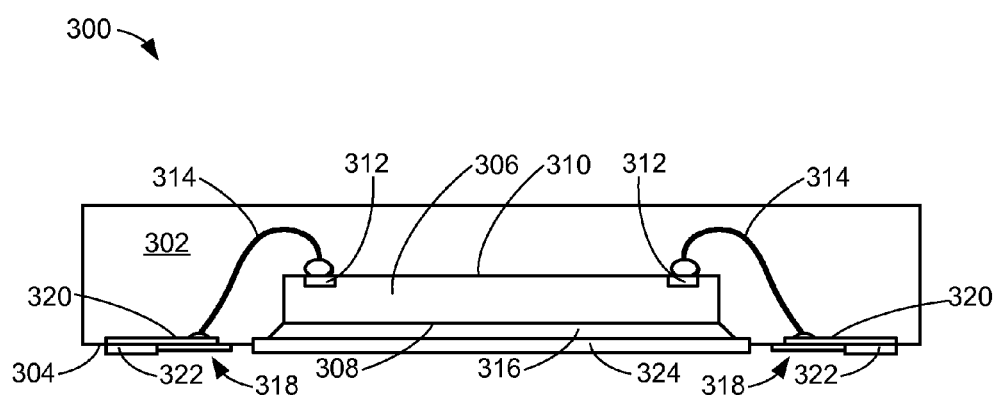
FIG. 3 is a cross-sectional view of a micro chip-scale-package system with thermal enhancement in another alternative embodiment of the present invention.

Referring now to FIG. 3, therein is shown a cross-sectional view of a micro chip-scale-package system 300 with thermal enhancement in another alternative embodiment of the present invention. In a manner similar to the micro chip-scale-package system 100, the micro chip-scale-package system 300 includes an encapsulant 302, having a bottom surface 304. The encapsulant 302 is applied over an integrated circuit die 306, having a non-active surface 308 and an active surface 310. The active surface 310 of the integrated circuit die 306 includes a bond surface 312 for an electrical interconnection 314. The non-active surface 308 of the integrated circuit die 306 is attached to a film (not shown) with a die attach material 316, such as a die attach adhesive. A metal pattern 318 includes a contact surface 320, as well as signal I/O pins 322. The electrical interconnection 314 connects the bond surface 312 of the active surface 310 to the contact surface 320 providing electrical connectivity between the integrated circuit die 306 and the metal pattern 318.

The micro chip-scale-package system 300 with thermal enhancement includes a heat spreader 324 attached to the bottom surface 304 of the encapsulant 302. The heat spreader 324 provides thermal dissipation for the integrated circuit die 306 and may provide power or ground level connection. For illustrative purposes, the micro chip-scale-package system 300 is shown with the heat spreader 324 having a homogenous material, although it is understood that the heat spreader 324 may be constructed differently and may include any number of materials. Further, for illustrative purposes, the micro chip-scale-package system 300 is shown with the electrical interconnection 114 as a wire bond, although it is understood that other electrical connectors may be used.

Figure 4:
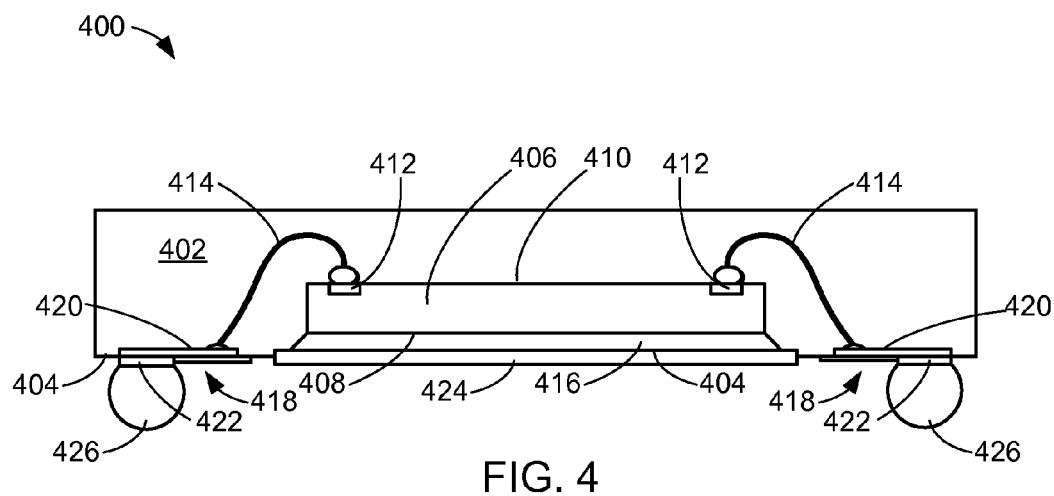
FIG. 4 is a cross-sectional view of a micro chip-scale-package system with system connectivity enhancement as well as thermal enhancement in yet another alternative embodiment of the present invention.

Referring now to FIG. 4, therein is shown a cross-sectional view of a micro chip-scale-package system 400 with system connectivity enhancement as well as thermal enhancement in yet another alternative embodiment of the present invention. In a manner similar to the micro chip-scale-package system 300, the micro chip-scale-package system 400 includes an encapsulant 402, having a bottom surface 404. The encapsulant 402 is applied over an integrated circuit die 406, having a non-active surface 408 and an active surface 410. The active surface 410 of the integrated circuit die 406 includes a bond surface 412 for an electrical interconnection 414. The non-active surface 408 of the integrated circuit die 406 is attached to a film (not shown) with a die attach material 416, such as a die attach adhesive. A metal pattern 418 includes a contact surface 420, as well as signal I/O pins 422. The electrical interconnection 414 connects the bond surface 412 of the active surface 410 to the contact surface 420 providing electrical connectivity between the integrated circuit die 406 and the metal pattern 418.

The micro chip-scale-package system 400 with thermal enhancement includes a heat spreader 424 attached to the bottom surface 404 of the encapsulant 402. The heat spreader 424 provides thermal dissipation for the integrated circuit die 406 and may provide power or ground level connection as well. A system interconnect 426, such as a solder ball, is attached to the signal I/O pins 422 of the metal pattern 418 and may be attached to the heat spreader 424. The system interconnect 426 may provide an alternative for connectivity of the micro chip-scale-package system 400 as well as additional thermal enhancement. Further, the system interconnect 426 may provide improvements, such as electrical performance, mechanical integrity, thermal dissipation, planar compensation, rework or isolation.

For illustrative purposes, the micro chip-scale-package system 400 is shown with the system interconnect 426 as solder balls, although it is understood that any system connectivity method or material may be used. Further, for illustrative purposes, the micro chip-scale-package system 400 is shown with the heat spreader 424 having a homogenous material, although it is understood that the heat spreader 424 may be constructed differently and may include any number of materials. Yet further, for illustrative purposes, the micro chip-scale-package system 400 is shown with the electrical interconnection 414 as a wire bond, although it is understood that other electrical connectors may be used.

Figure 5:
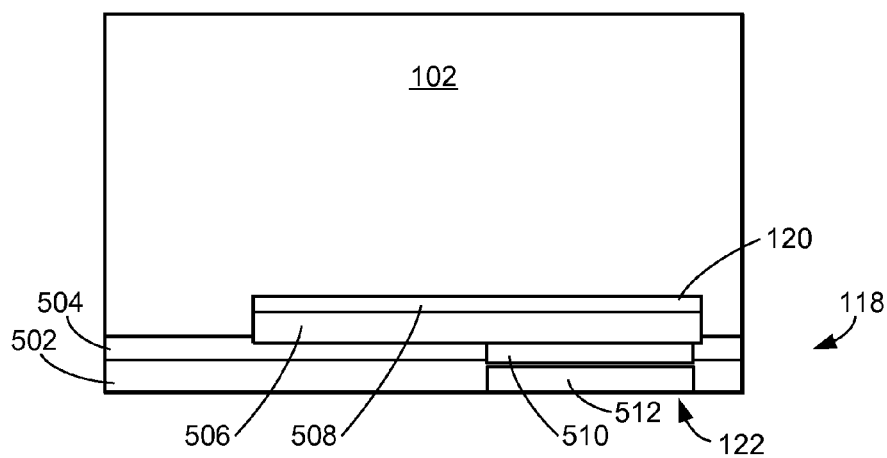
FIG. 5 is a cross-sectional view of the metal pattern in an encapsulation phase.

Referring now to FIG. 5, therein is shown a cross-sectional view of the metal pattern 118 in an encapsulation phase. A temporary film 502, such as a thin and soft substrate, includes an adhesion material 504 to prevent delamination between the metal pattern 118 and the encapsulant 102. The metal pattern 118 includes a copper pattern 506, a gold pattern 508, a nickel coation 510 and a gold coating 512. The copper pattern 506 and the gold pattern 508 provide the contact surface 120 as well as electrical connectivity between regions of the contact surface 120. The nickel coation 510 and the gold coating 512 provide the signal I/O pins 122 and the connection between the signal I/O pins 122 and the contact surface 120.

The temporary film 502 and the adhesion material 504 provide a temporary substrate for the metal pattern 118 and a mounting surface for the integrated circuit die 106 of FIG. 1. It has been discovered that the encapsulant 102 provides structural integrity and support for the metal pattern 118 and the integrated circuit die 106. The encapsulant 102 holds the metal pattern 118 and the integrated circuit die 106 in substantially fixed positions over the temporary film 502 and the adhesion material 504. The substantially fixed positions provide integrity and protection for connections within the micro chip-scale-package system 100 after the temporary film 502 and a portion or all of the adhesion material 504 material is removed to expose the bottom of the encapsulant 102 as shown in FIG. 1.

For illustrative purposes, a portion of the metal pattern 118 is shown, although it is understood that the metal pattern 118 may include any number or size of the copper pattern 506, the gold pattern 508, the nickel coation 510 and the gold coating 512 or be different, as well. The metal pattern 118 is formed in substantially the same manner as the metal pattern 218, the metal pattern 318, and the metal pattern 418.

Figure 6:
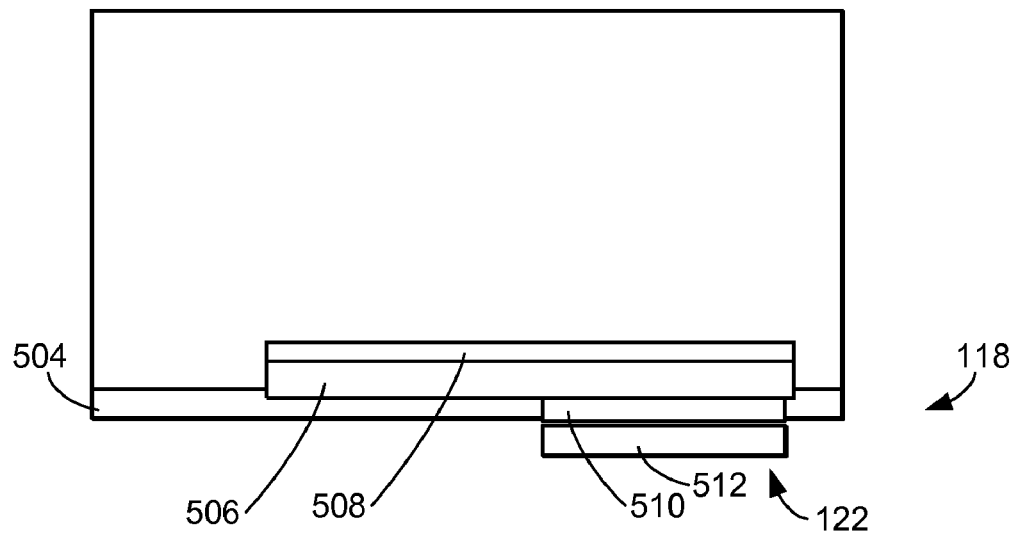
FIG. 6 is a cross-sectional view of the metal pattern in a film removal phase.

Referring now to FIG. 6, therein is shown a cross-sectional view of the metal pattern 118 in a film removal phase. The temporary film 502 of FIG. 5 is removed from the adhesion material 504 and the metal pattern 118, substantially exposing the adhesion material 504 and the signal I/O pins 122 of the metal pattern 118. A portion of the adhesion material 504 may also be removed, substantially exposing the signal I/O pins 122 providing electrical connection to a next level system (not shown) or the system interconnect 426. It has been discovered that the removal of the temporary film 502 provides a package without substrate, such as the micro chip-scale-package system 100. For illustrative purposes, a portion of the metal pattern 118 is shown, although it is understood that the metal pattern 118 may include any number or size of the copper pattern 506, the gold pattern 508, the nickel coation 510 and the gold coating 512 or be different, as well.

Figure 7:
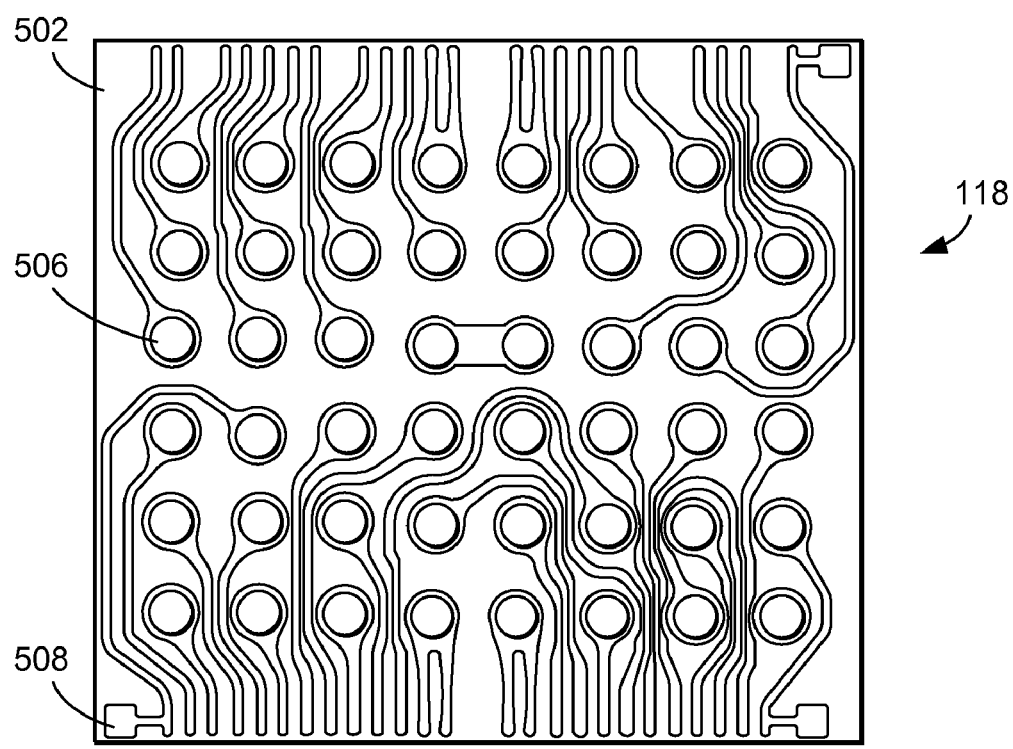
FIG. 7 is a top plan view of the temporary film including the metal pattern.

Referring now to FIG. 7, therein is shown a top plan view of the temporary film 502 including the metal pattern 118. The metal pattern 118 includes the copper pattern 506 and the gold pattern 508 on a surface facing the integrated circuit die 106 of FIG. 1. The copper pattern 506 and the gold pattern 508 provide electrical connectivity for the electrical interconnection 114 of FIG. 1. The electrical interconnection 114 is connected to the bond surface 112 of FIG. 1 of the active surface 110 of FIG. 1 of the integrated circuit die 106. The copper pattern 506 and the gold pattern 508 provide physical routing of I/O signals from the integrated circuit die 106 to a next level system (not shown).

For illustrative purposes, the metal pattern 118 is shown as formed with forty-eight instances of the contact surface 120, although it is understood that any number or shape of instances of the contact surface 120 may be formed.

Figure 8:
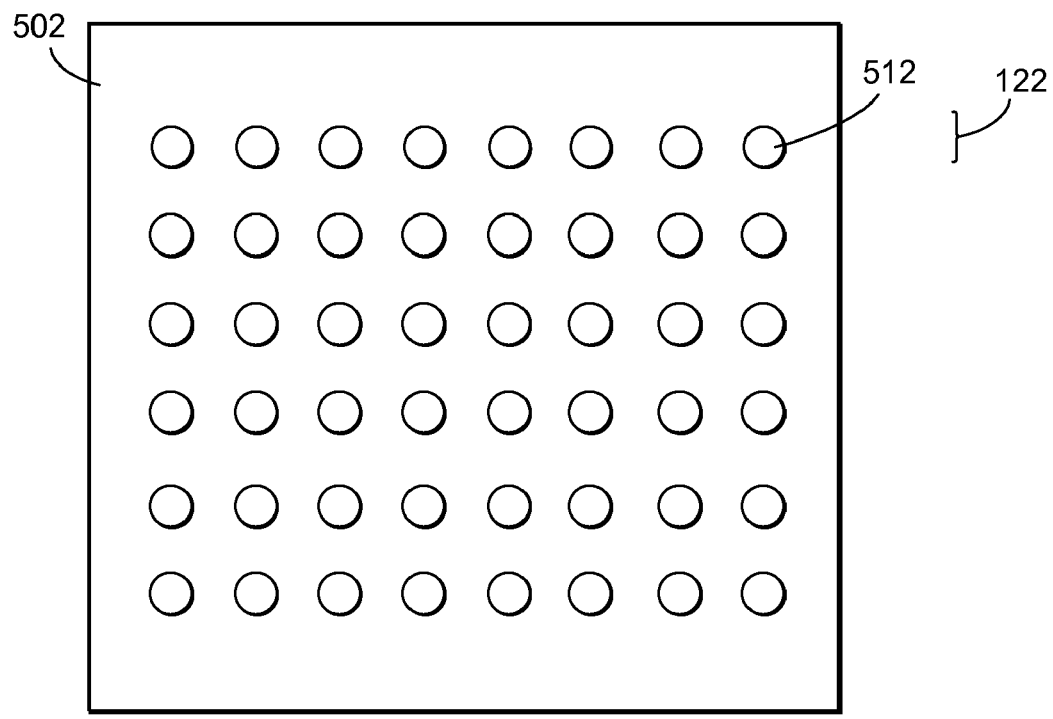
FIG. 8 is a bottom plan view of the temporary film including the metal pattern.

Referring now to FIG. 8, therein is shown a bottom plan view of the temporary film 502 including the metal pattern 118. The metal pattern 118 includes the nickel coation 510 of FIG. 5 and the gold coating 512 on a surface opposite the integrated circuit die 106 of FIG. 1. The nickel coation 510 and the gold coating 512 form the signal I/O pins 122 providing connectivity for the I/O signals from the integrated circuit die 106 to a next level system (not shown). The nickel coation 510 and the gold coating 512 may also provide an attachment surface for the system interconnect 426 of FIG. 4. For illustrative purposes, the metal pattern 118 is shown as formed with forty-eight instances of the signal I/O pins 122, although it is understood that any number or shape of instances of the signal I/O pins 122 may be formed.

Figure 9:
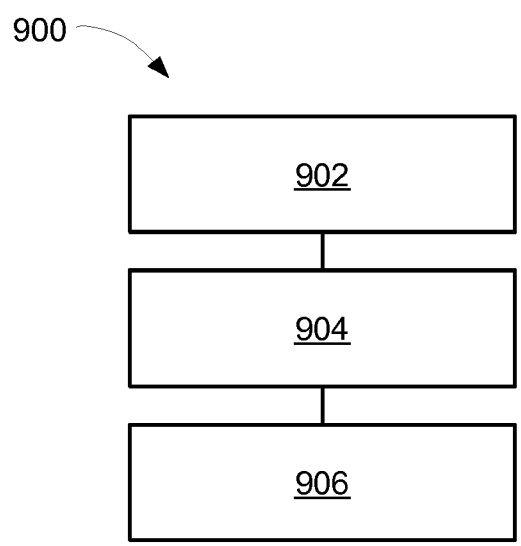
FIG. 9 is a flow chart of a micro-chip-scale system for manufacturing the micro chip-scale-package system.

Referring now to FIG. 9 is a flow chart of a micro chip-scale-package system 900 for manufacturing the micro chip-scale-package system 100. The system 900 includes providing a metal pattern in a block 902; attaching an integrated circuit die on the metal pattern in a block 904; and molding an encapsulant over the integrated circuit die and the metal pattern in a block 906.

In greater detail, a method to fabricate the micro chip-scale-package system 100, in an embodiment of the present invention, is performed as follows:

1. Forming the metal pattern 118 on the adhesion material and over the temporary film 502. (FIG. 5)
2. Mounting the integrated circuit die 106 over the temporary film 502 having the electrical interconnection 114 between the integrated circuit die 106 and the temporary film 502. (FIG. 1)
3. Molding the encapsulant 102 over the integrated circuit die 106 and the electrical interconnection 114 on the temporary film 502. (FIG. 1)
4. Removing the temporary film 502 and substantially exposing the signal I/O pins 122. (FIG. 6)

It has been discovered that the present invention thus has numerous aspects.

An aspect is that the present invention allows the package to be of a smaller size. The thinness of the film or substrate as well as its removal to expose the package pins provides a significantly smaller form factor.

It has been discovered that the disclosed structure provides a more reliable packaged device. The elimination of a solder mask and the substrate provide improved adhesion for the mold compound or encapsulant.

It has also been discovered that the disclosed structure provides for higher I/O pin count. The I/O pin count is not restricted to peripheral leads and the signal I/O pins can be located across the surface area of the package.

Yet another discovery of the disclosed structure is improved performance. The thin z-dimension for the metal pattern provides significantly shorter distances from the top side of the metal pattern to the bottom side of the metal pattern.

Yet another discovery of the disclosed structure is a much simpler assembly process. The materials do not require special handling or processing. The processing steps are also fewer in number and requirements.

Yet another discovery of the disclosed structure is an easily applied to high volume production processes. Existing high volume processes and equipment are directly applicable to the manufacturing requirements.

These and other valuable aspects of the present invention consequently further the state of the technology to at least the next level.

Thus, it has been discovered that the micro chip-scale-package system method and apparatus of the present invention furnish important and heretofore unknown and unavailable solutions, capabilities, and functional aspects. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

The invention claimed is:

1. A micro chip-scale-package system comprising:
   providing a plurality of metal patterns on an adhesion material on a film, a portion of the plurality of metal patterns extending in the film;
   attaching an integrated circuit die to the plurality of metal patterns;
   molding an encapsulant over the integrated circuit die and the plurality of metal patterns; and
   removing the film from the adhesion material and a portion of the adhesion material leaving the remainder of the adhesion material on a portion of the plurality of metal patterns.

2. The system as claimed in claim 1 wherein molding the encapsulant comprises holding the plurality of metal patterns and the encapsulant on the adhesion material.

3. The system as claimed in claim 1 wherein providing the plurality of metal patterns comprises:
   forming a first set of signal I/O pins; and
   forming a second set of signal I/O pins for increased I/O pin count.

4. The system as claimed in claim 1 further comprising attaching a heat spreader on a bottom surface of the micro chip-scale-package system.

5. The system as claimed in claim 1 further comprising attaching a heat spreader on a bottom surface of the micro chip-scale package system and a system interconnect on signal I/O pins.

6. A micro chip-scale-package system comprising:
   forming a plurality of metal patterns on an adhesion material and over a temporary film, a portion of the plurality of metal patterns extending in the film;
   mounting an integrated circuit die over the temporary film having an electrical interconnection between the integrated circuit die and the plurality of metal patterns;
   molding an encapsulant over the integrated circuit die and the electrical interconnection on the temporary film; and
   removing the temporary film from the adhesion material and a portion of the adhesion material leaving the remainder of the adhesion material on a portion of the plurality of metal patterns.

7. The system as claimed in claim 6 wherein molding the encapsulant comprises holding the plurality of metal patterns and the integrated circuit substantially fixed in the encapsulant.

8. The system as claimed in claim 6 wherein mounting the integrated circuit die comprises applying a die attach adhesive between the film and the integrated circuit die.

9. The system as claimed in claim 6 further comprising attaching a system interconnect formed from solder.

10. A micro chip-scale-package system comprising:
    a plurality of metal patterns on an adhesion material on a film, a portion of the plurality of metal patterns extending in the film;
    an integrated circuit die attached to the plurality of metal patterns;
    an encapsulant over the integrated circuit die and the plurality of metal patterns with the film and a portion of the adhesion material removed leaving the remainder of the adhesion material on a portion of the plurality of metal patterns.

11. The system as claimed in claim 10 wherein the encapsulant comprises the plurality of metal patterns and the encapsulant on the adhesion material.

12. The system as claimed in claim 10 wherein the plurality of metal patterns comprises:
    a first set of signal I/O pins; and
    a second set of signal I/O pins for increased I/O pin count.

13. The system as claimed in claim 10 further comprising a heat spreader on a bottom surface of the micro chip-scale-package system.

14. The system as claimed in claim 10 further comprising a heat spreader on a bottom surface of the micro chip-scale package system and a system interconnect on signal I/O pins.

15. The system as claimed in claim 10 wherein:
    the plurality of metal patterns is the plurality of metal patterns over a temporary firm, a portion of the plurality of metal patterns extending in the film;
    the integrated circuit die is the integrated circuit die over the temporary film having an electrical interconnection between the integrated circuit die and the plurality of metal patterns; and
    the encapsulant is the encapsulant over the integrated circuit die and the electrical interconnection on the temporary film with the temporary film removed from the adhesion material and a portion of the adhesion material leaving the remainder of the adhesion material on a portion of the plurality of metal patterns.

16. The system as claimed in claim 15 wherein the encapsulant comprises the plurality of metal patterns and the integrated circuit substantially fixed in the encapsulant.

17. The system as claimed in claim 15 wherein the integrated circuit die comprises a die attach adhesive between the film and the integrated circuit die.

18. The system as claimed in claim 15 further comprising a system interconnect formed from solder.

* * * * *

UNITED STATES PATENT AND TRADEMARK OFFICE
CERTIFICATE OF CORRECTION

PATENT NO.            : 7,652,382 B2                                             Page 1 of 1
APPLICATION NO. : 11/869737
DATED                  : January 26, 2010
INVENTOR(S)         : Kim et al.

It is certified that error appears in the above-identified patent and that said Letters Patent is hereby corrected as shown below:

Column 8:

Claim 15, line 42, delete "firm," and insert therefor --film,--

Signed and Sealed this

Sixteenth Day of March, 2010

David J. Kappos
*Director of the United States Patent and Trademark Office*